United States Patent
Dommaschk et al.

(10) Patent No.: US 8,183,874 B2
(45) Date of Patent: May 22, 2012

(54) MONITORING OF THE AGING OF THE CAPACITORS IN A CONVERTER BY MEANS OF CAPACITANCE MEASUREMENT

(75) Inventors: Mike Dommaschk, Guteborn (DE); Jörg Dorn, Buttenheim (DE); Ingo Euler, Erlangen (DE); Jörg Lang, Stadtsteinach (DE); Quoc-Buu Tu, Rosstal (DE); Klaus Würflinger, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 413 days.

(21) Appl. No.: 12/517,817

(22) PCT Filed: Dec. 8, 2006

(86) PCT No.: PCT/DE2006/002250
§ 371 (c)(1),
(2), (4) Date: Jun. 19, 2009

(87) PCT Pub. No.: WO2008/067787
PCT Pub. Date: Jun. 12, 2008

(65) Prior Publication Data
US 2010/0321038 A1    Dec. 23, 2010

(51) Int. Cl.
*G01R 27/26* (2006.01)
*H02M 7/00* (2006.01)

(52) U.S. Cl. .......................................... 324/658; 363/123
(58) Field of Classification Search .................. 324/658, 324/649, 600; 363/123, 13, 37
See application file for complete search history.

(56) References Cited

U.S. PATENT DOCUMENTS
2005/0169018 A1* 8/2005 Hatai et al. ...................... 363/37
2007/0033432 A1* 2/2007 Pecone et al. ...................... 714/6

FOREIGN PATENT DOCUMENTS
DE     10103031 A1     7/2002
DE     10309937 A1     9/2004

* cited by examiner

*Primary Examiner* — Hoai-An D Nguyen
(74) *Attorney, Agent, or Firm* — Laurence A. Greenberg; Werner H. Stemer; Ralph E. Locher

(57) ABSTRACT

A method and a device for converting an electrical current include at least one phase module having an AC voltage connection and at least one DC voltage connection. A phase module branch is disposed between each DC voltage connection and the AC voltage connection. Each phase module branch includes a series circuit of submodules, each having a capacitor and at least one power semiconductor. The apparatus can establish aging of an energy storage device in a simple manner by using a capacitor diagnosis device for a time-dependent determination of the capacitance of each capacitor.

2 Claims, 2 Drawing Sheets

MONITORING OF THE AGING OF THE CAPACITORS IN A CONVERTER BY MEANS OF CAPACITANCE MEASUREMENT

BACKGROUND OF THE INVENTION

Field of the Invention

The present invention relates to a device for converting an electrical current with at least one phase module, which has an AC voltage connection and at least one DC voltage connection, a phase module branch being formed between each DC voltage connection and the AC voltage connection, and each phase module branch having a series circuit comprising submodules, which each have a capacitor and at least one power semiconductor.

The invention furthermore relates to a method for converting a current.

Such a device and such a method are known, for example, from the paper by A. Lesnicar and R. Marquardt "An Innovative Modular Multilevel Converter Topology Suitable for a Wide Power Range", which was presented at Powertech 2003. This paper discloses a power converter, which is intended to be connected to an AC voltage system. The power converter has a phase module for each phase of the AC voltage system to be connected to it, each phase module having an AC voltage connection and two DC voltage connections. Phase module branches extend between each DC voltage connection and the AC voltage connection such that a so-called 6-pulse bridge circuit is provided. The module branches comprise a series circuit of submodules, which each comprise two disconnectable power semiconductors, with which in each case inverse freewheeling diodes are connected in parallel. The disconnectable power semiconductors and the freewheeling diodes are connected in series, with a capacitor being provided in parallel with said series circuit. Said components of the submodules are wired to one another such that either the capacitor voltage or the voltage zero is dropped across the two-pole output of each submodule.

The disconnectable power semiconductors are controlled by means of so-called pulse width modulation. The regulating means for controlling the power semiconductors have measuring sensors for detecting currents whilst obtaining current values. The current values are supplied to a central control unit, which has an input interface and an output interface. A modulator, i.e. a software routine, is provided between the input interface and the output interface. The modulator has, inter alia, a selector unit and a pulse width generator. The pulse width generator generates the control signals for the individual submodules. The disconnectable power semiconductors are changed over from an on-state position, in which a current flow via the disconnectable power semiconductors is made possible, to an off-state position, in which a current flow via the disconnectable power semiconductors is interrupted, by means of the control signals generated by the pulse width generator. In this case, each submodule has a submodule sensor for detecting a voltage dropped across the capacitor.

Further papers relating to the control method for a so-called multi-level power converter topology are known from R. Marquardt, A. Lesnicar, J. Hildinger "Modulares Stromrichterkonzept für Netzkupplungsanwendung bei hohen Spannungen" [Modular power converter concept for power supply system coupling application in the case of high voltages], presented at the ETG technical conference in Bad Nauenheim, Germany 2002, from A. Lesnicar, R. Marquardt, "A new modular voltage source inverter topology", EPE' 03 Toulouse, France 2003 and from R. Marquardt, A. Lesnicar "New Concept for High Voltage—Modular Multilevel Converter", PESC 2004 Conference in Aachen, Germany.

The German patent application 10 2005 045 090.3, which is as yet unpublished, discloses a method for controlling a polyphase power converter with distributed energy storage devices. The disclosed device likewise has a multi-level power converter topology with phase modules, which have an AC voltage connection arranged symmetrically in the centre of each phase module and two DC voltage connections. Each phase module comprises two phase module branches, which extend between the AC voltage connection and one of the DC voltage connections. In turn, each phase module branch comprises a series circuit of submodules, each submodule comprising disconnectable power semiconductors and freewheeling diodes reverse-connected in parallel therewith. In addition, each submodule has a unipolar capacitor. Regulating means are used for regulating the power semiconductors, which regulating means are also designed to set branch currents which flow between the phase modules. By controlling the branch currents, current oscillations, for example, can be actively damped and operating points at lower output frequencies can be avoided. Furthermore, uniform loading of all of the disconnectable semiconductor switches and symmetrization of very asymmetrical voltages can be brought about.

Energy storage devices such as, for example, capacitors in the intermediate circuit of power converter modules have the property that they age during operation. In this case, capacitors lose capacitance, as a result of which, at a specific voltage, the charge stored by them becomes smaller and smaller. In the maintenance of installations of intermediate circuit power converters it would be advantageous to know which capacitors have lost so much capacitance that replacement is necessary. It is thereby possible to reduce the failure rate of the capacitors during operation of the power converter and to increase availability. In power converter topologies having large common intermediate circuit capacitors such as in two-point or three-point technology, for example, it makes little sense to monitor the capacitance reduction of the capacitors since the change would only amount to a fraction of the total capacitance and would therefore be virtually undetectable meteorologically. However, such a capacitance reduction can lead to the failure of the power converter. A further disadvantage of the large common intermediate circuit capacitors is that the latter can be exchanged or replaced only with difficulty or not at all.

BRIEF SUMMARY OF THE INVENTION

It is an object of the invention to provide a device of the type mentioned in the introduction with which aging of the capacitors can be ascertained in a simple manner.

The invention achieves this object through capacitor diagnosis means for the time-dependent determination of the capacitance of each capacitor.

The invention provides capacitor diagnosis means, which continually determine the capacitance of the capacitors of the device according to the invention. The device according to the invention has distributed capacitors with a correspondingly lower capacitance than devices having a central capacitor in the DC voltage circuit. It has been recognized that it is now possible to detect the capacitance change meteorologically. In the context of the invention, it is less crucial to know what capacitance the individual capacitors have exactly. Rather, it is important to find out how the capacitances of the individual capacitors change over time. It is thus possible for capacitors having decreasing capacitance to be differentiated from faultfree capacitors and be detected. According to the invention, the respective capacitance of the individual capacitors is therefore determined by means of the capacitor diagnosis means in a manner dependent on time.

Expediently, the capacitor diagnosis means have for each phase module a branch current sensor for detecting a phase module branch current flowing in the assigned phase module, and for each submodule a submodule sensor for detecting a capacitor voltage dropped across the capacitor of the assigned submodule and also means for detecting the switching states of the respectively assigned submodule, an evaluation unit determining the capacitance of the capacitors of each phase module in a manner dependent on the respectively measured phase module branch current Izwg, the switching state or states and the respective capacitor voltage Uc. This integration—divided into temporal intervals—of the detected branch current yields the charge change $\Delta Q$ of the capacitors of the monitored phase module. The submodule sensors serve for detecting the voltage dropped across the respective capacitor. The capacitance of each capacitor results from the division of the charge change $\Delta Q$ by the voltage change $\Delta Uc$, the voltage and the charge being detected in each case between the turn-on and turn-off instants of the submodule. If the submodule is turned on, the capacitor voltage is dropped across the output terminals of the submodule. In the turned-off state, the voltage zero is dropped across the terminals.

Proceeding from the method mentioned in the introduction, the invention achieves said object by means of a converter having at least one phase module having at least one DC voltage connection and an AC voltage connection, a phase module branch being formed between each DC voltage connection and the AC voltage connection, said phase module branch having a series circuit comprising submodules, which each have a capacitor and at least one power semiconductor, in which the capacitance of the capacitor is determined in a manner dependent on time.

In accordance with a further development that is expedient in this regard, in a manner dependent on time, the phase module branch current of each phase module is detected whilst obtaining phase module branch current values and the capacitor voltage dropped across each capacitor is measured whilst obtaining capacitor voltage values and, finally, a voltage change is determined, the phase module branch current, for obtaining the charge change between the turn-on and turn-off of the power semiconductors of the submodules, is integrated and the change in the capacitance $\Delta C$ of the capacitors of the respective phase module is determined from the charge change and from the voltage change. Turning on and turning off the power semiconductors should be understood to mean the switching states of the power semiconductors in which a current flow to the capacitor in the respective submodule is made possible.

BRIEF DESCRIPTION OF THE SEVERAL VIEWS OF THE DRAWING

Further configurations and advantages of the invention are the subject matter of the following description of exemplary embodiments of the invention with reference to the figures in the drawing, wherein identical reference symbols refer to identically acting component parts, and wherein.

DESCRIPTION OF THE INVENTION

Figure 1:
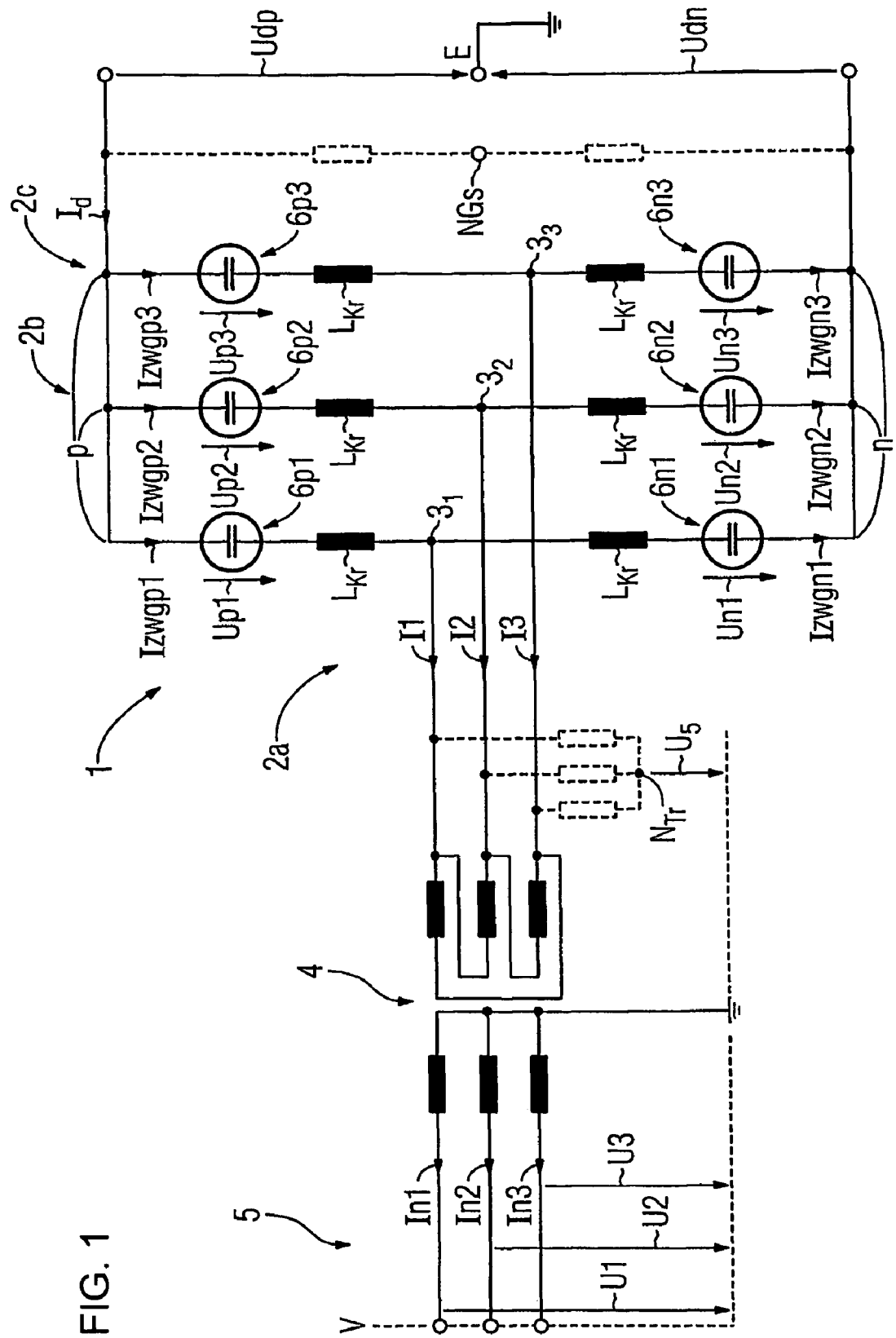
FIG. 1 shows an exemplary embodiment of the device according to the invention.

FIG. 1 shows an exemplary embodiment of the device 1 according to the invention which comprises three phase modules 2a, 2b and 2c. Each phase module 2a, 2b and 2c is connected to a positive DC voltage line p and to a negative DC voltage line n, with the result that each phase module 2a, 2b, 2c has two DC voltage connections. In addition, in each case one AC voltage connection $3_1$, $3_2$, $3_3$ is provided for each phase module 2a, 2b and 2c. The AC voltage connections $3_1$, $3_2$, $3_3$ are connected to a three-phase AC voltage system 5 via a transformer 4. The phase voltages U1, U2 and U3 drop across the phases of the AC voltage system 5, with system currents In1, In2 and In3 flowing. The AC-voltage-side phase current of each phase module is denoted by 11, 12 and 13. The DC voltage current is $I_d$. Phase module branches 6p1, 6p2 and 6p3 extend between each of the AC voltage connections $3_1$, $3_2$, or $3_3$ and the positive DC voltage line p. The phase module branches 6n1, 6n2 and 6n3 are formed between each AC voltage connection $3_1$, $3_2$, $3_3$ and the negative DC voltage line n. Each phase module branch 6p1, 6p2, 6p3, 6n1, 6n2 and 6n3 comprises a series circuit of submodules (not illustrated in detail in FIG. 1) and an inductance, which is denoted by $L_{Kr}$ in FIG. 1.

Figure 2:
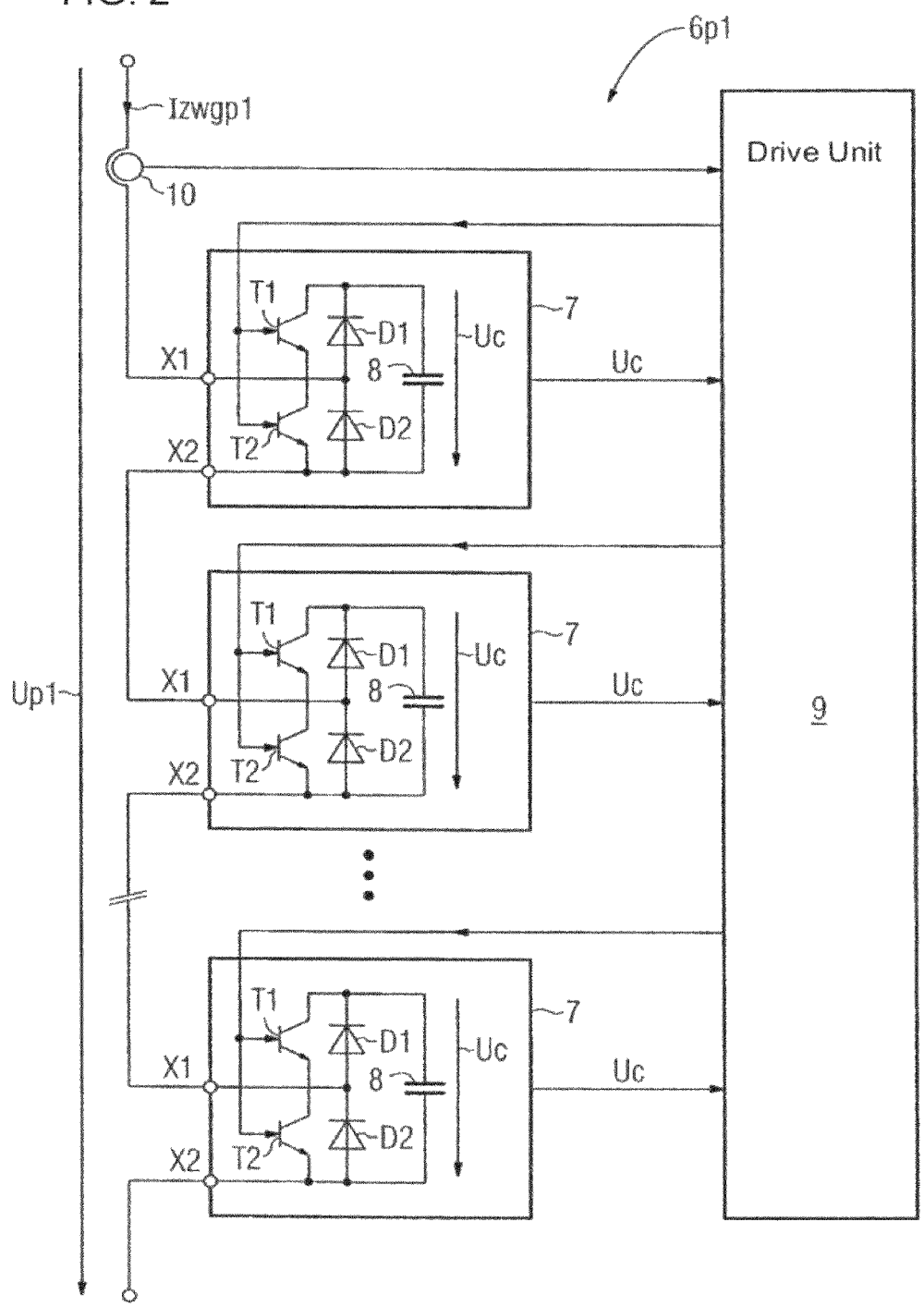
FIG. 2 shows a phase module of a device in accordance with FIG. 1.

FIG. 2 illustrates the series circuit of the submodules 7 and in particular the design of the submodules by means of an electrical equivalent circuit diagram in more detail, with only the phase module branch 6p1 being singled out in FIG. 2. The rest of the phase module branches have an identical design, however. It can be seen that each submodule 7 has two disconnectable power semiconductor switches T1 and T2 connected in series. Disconnectable power semiconductors are, for example, so-called IGBTs, GTOs, IGCTs or the like. They are known to a person skilled in the art as such, with the result that a detailed illustration is not required at this juncture. A freewheeling diode D1, D2 is reverse-connected in parallel with each disconnectable power semiconductor T1, T2. A capacitor 8 is connected as the energy storage device in parallel with the series circuit of the disconnectable power semiconductors T1, T2 or the freewheeling diodes D1 and D2. Each capacitor 8 is charged in unipolar fashion. Two voltage states can now be generated at the two-pole connection terminals X1 and X2 of each submodule 7. If, for example, a drive signal is generated by a drive unit 9, with which drive signal the disconnectable power semiconductor T2 is changed over into its on-state position, in which a current flow via the power semiconductor T2 is made possible, the voltage zero is dropped across the terminals X1, X2 of the submodule 7. In this case, the disconnectable power semiconductor T1 is in its off-state position, in which a current flow via the disconnectable power semiconductor T1 is interrupted. This prevents the discharge of the capacitor 8. If, on the other hand, the disconnectable power semiconductor T1 is changed over to its on-state position, but the disconnectable power semiconductor T2 is changed over to its off-state position, the full capacitor voltage Uc is present at the terminals X1, X2 of the submodule 7.

The exemplary embodiment of the device according to the invention shown in FIGS. 1 and 2 is also referred to as a so-called multi-level power converter. Such a multi-level power converter is suitable, for example, for driving electrical machines, such as motors or the like, for example. Furthermore, such a multi-level power converter is also suitable for use in the sector of energy distribution and transmission. Thus, the device according to the invention is used, for example, as a back-to-back link, which comprises two power converters which are connected to one another on the DC-voltage side, the power converters each being connected to an AC voltage system.

Such back-to-back links are used for the exchange of energy between two energy distribution systems, the energy distribution systems having, for example, a different frequency, phase angle, neutral-point connection or the like. Furthermore, applications in the field of wattless power compensation as so-called FACTS (Flexible AC Transmission Systems) come into consideration. High-voltage DC transmission over long distances is also conceivable with such multi-level power converters.

It can furthermore be discerned in FIG. 2 that a branch current sensor 10 is provided for measuring the branch currents, which sensor detects the current flowing via the phase module whilst obtaining phase module branch current values, the branch current values being transmitted via an optical fiber communication line toward the evaluation unit 9. Furthermore, submodule sensors (not illustrated in the drawing) are provided for each submodule 7, said sensors being used to detect a voltage drop Uc across the capacitors 8 whilst obtaining capacitor voltage values. The capacitor voltage values are likewise transmitted to the evaluation unit 9, in which case information regarding the capacitor to which the respective measured value relates is simultaneously included. The evaluation unit assigns the incoming measured value to a measurement time. Integration in sections of the phase module branch current $I_{zwg}$ yields the charge change $\Delta Q$ of the capacitors 8 of the respective phase module. The expression integration in sections should be understood to mean an integration in specific time intervals. In other words, integration is effected only when the switching states of the power semiconductors of the respective submodule permit the current flow to the capacitor of the submodule. As a result of the determination of a voltage change, that is to say the change in the voltage dropped across the capacitor 8 in a specific time duration, the capacitance of the capacitors results in accordance with $$C \approx \frac{\Delta Q}{\Delta UC}$$

The invention claimed is:

1. A device for converting an electrical current, the device comprising: at least one phase module each having an AC voltage connection, at least one DC voltage connection, and at least one phase module branch respectively disposed between each said at least one DC voltage connection and said AC voltage connection;
   each said at least one phase module branch having a series circuit including submodules each having a capacitor and at least one power semiconductor; and
   a capacitor diagnosis device for a time-dependent determination of a capacitance of said capacitor of each of said submodules;
   said capacitor diagnosis device including, for each said at least one phase module, a branch current sensor for detecting a phase module branch current flowing in a respective phase module, a submodule sensor for each of said submodules for detecting a capacitor voltage dropped across said capacitor of a respective submodule, a device for detecting switching states of said at least one power semiconductor of said respective submodule, and an evaluation unit determining said capacitance of said capacitors of each said at least one phase module in a manner dependent on a respectively measured branch current, said switching states of said at least one power semiconductor and a respective capacitor voltage.

2. A method for converting a current, the method which comprises the following steps:
   providing a converter including at least one phase module each having at least one DC voltage connection, an AC voltage connection, and at least one phase module branch respectively disposed between each said at least one DC voltage connection and said AC voltage connection;
   providing each said at least one phase module branch with a series circuit including submodules each having a capacitor and at least one power semiconductor;
   determining a capacitance of said capacitor of each of said submodules in a manner dependent on time; and
   detecting a branch current of each phase module while obtaining branch current values and measuring a capacitor voltage dropped across said capacitor of each submodule while obtaining capacitor voltage values and finally determining a voltage change, integrating said phase module branch current, for obtaining a charge change between a turn-on and a turn-off of said at least one power semiconductor of the submodules, in sections and determining a change in the capacitance of said capacitors of said respective phase module from said charge change and from said voltage change.

* * * * *